United States Patent
Kachru et al.

(10) Patent No.: US 9,476,763 B2
(45) Date of Patent: Oct. 25, 2016

(54) PLANAR LIGHT WAVE CIRCUIT BASED OPTICAL TRANSCEIVER ASSEMBLY

(71) Applicant: Cisco Technology, Inc., San Jose, CA (US)

(72) Inventors: Ravinder Kachru, San Jose, CA (US); Stefan Martin Pfnuer, San Jose, CA (US); Pangchen Sun, San Diego, CA (US)

(73) Assignee: Cisco Technology, Inc., San Jose, CA (US)

( * ) Notice: Subject to any disclaimer, the term of this patent is extended or adjusted under 35 U.S.C. 154(b) by 155 days.

(21) Appl. No.: 14/155,927

(22) Filed: Jan. 15, 2014

(65) Prior Publication Data
US 2015/0198478 A1    Jul. 16, 2015

(51) Int. Cl.
*G01J 1/04* (2006.01)

(52) U.S. Cl.
CPC ............. *G01J 1/0425* (2013.01); *Y10T 29/41* (2015.01)

(58) Field of Classification Search
CPC ............................ H04L 25/14; H04N 21/434
USPC ................ 250/227.11; 385/92; 370/536, 542
See application file for complete search history.

(56) References Cited

U.S. PATENT DOCUMENTS

| | | | |
|---|---|---|---|
| 4,773,063 A * | 9/1988 | Hunsperger et al. | ............ 398/87 |
| 2002/0197025 A1* | 12/2002 | Vaganov | ................ G02B 6/423 385/92 |
| 2009/0194873 A1* | 8/2009 | Lim | ............................. 257/738 |
| 2010/0247043 A1* | 9/2010 | Sugawara et al. | .............. 385/93 |
| 2010/0303463 A1 | 12/2010 | Bernasconi | |
| 2012/0087678 A1 | 4/2012 | Earnshaw | |
| 2013/0142483 A1* | 6/2013 | Hasegawa et al. | ............. 385/37 |
| 2014/0341578 A1* | 11/2014 | Ho et al. | ......................... 398/68 |

FOREIGN PATENT DOCUMENTS

| | | |
|---|---|---|
| EP | 0978740 B1 | 2/2000 |
| WO | 2004017428 A1 | 2/2004 |

* cited by examiner

*Primary Examiner* — Renee Chavez
(74) *Attorney, Agent, or Firm* — Edell, Shapiro & Finnan, LLC (57) ABSTRACT

An apparatus is provided in which a photodiode supported on a planar light wave circuit assembly and arranged such that a photosensitive portion of the photodiode is aligned along an optical path from the output of the planar light wave circuit to the photodiode of the planar light wave circuit assembly. The photodiode is arranged such that a spot size of light output from the planar light wave circuit is incident on the photosensitive portion such that an optical signal transmitted by the light output is converted to an electric signal by the photodiode. A mounting structure is arranged between the planar light wave circuit assembly and the photodiode in order to support the photodiode on the planar light wave circuit assembly. The optical path of the light output from the planar light wave circuit does not contain any refractive optical elements.

20 Claims, 9 Drawing Sheets

PLANAR LIGHT WAVE CIRCUIT BASED OPTICAL TRANSCEIVER ASSEMBLY

TECHNICAL FIELD

The present disclosure relates to optical transceiver assemblies, and in particular, transceiver assemblies for multiplexed optical signals.

BACKGROUND

In order to increase optical signal bandwidth, optical communications are sent over fiber optic communication lines as wavelength multiplexed signals. For example, a 100G LR4 optical transceiver signal consists of 4 wavelengths separated by 800 GHz traveling on a single fiber. Each wavelength signal is modulated at 25 Gbps so that when they are combined they provide a composite 100 Gbps signal. When received at its intended destination, the optical signal is demultiplexed into its individual wavelengths and then converted to respective electrical signals using photodiodes.

A typical optical transceiver demultiplexes the combined signal using thin film filters with pass bands that are separated by 800 GHz. Once demultiplexed, the different wavelengths that were combined to form the composite signal are steered to a wavelength specific photodiode using actively aligned mirrors. Other demultiplexers utilize Indium Phosphate semiconductor devices which can double as both a demultiplexer and a photodetector. Unfortunately, the Indium Phosphate devices experience high insertion loss, and must be kept at high temperatures due the high temperature dependence of the Indium Phosphate semiconductor material.

DESCRIPTION OF EXAMPLE EMBODIMENTS

Overview

An apparatus is provided in which a photodiode is supported on a planar light wave circuit assembly and arranged such that a photosensitive portion of the photodiode is aligned along an optical path from the output of the planar light wave circuit to the photodiode of the planar light wave circuit assembly. The photodiode is arranged such that a spot size of light output from the planar light wave circuit is incident on the photosensitive portion such that an optical signal transmitted by the light output is converted to an electric signal by the photodiode. A mounting structure is arranged between the planar light wave circuit assembly and the photodiode in order to support the photodiode on the planar light wave circuit assembly. The optical path of the light output from the planar light wave circuit does not contain any refractive optical elements.

Example Embodiments

Figure 1:
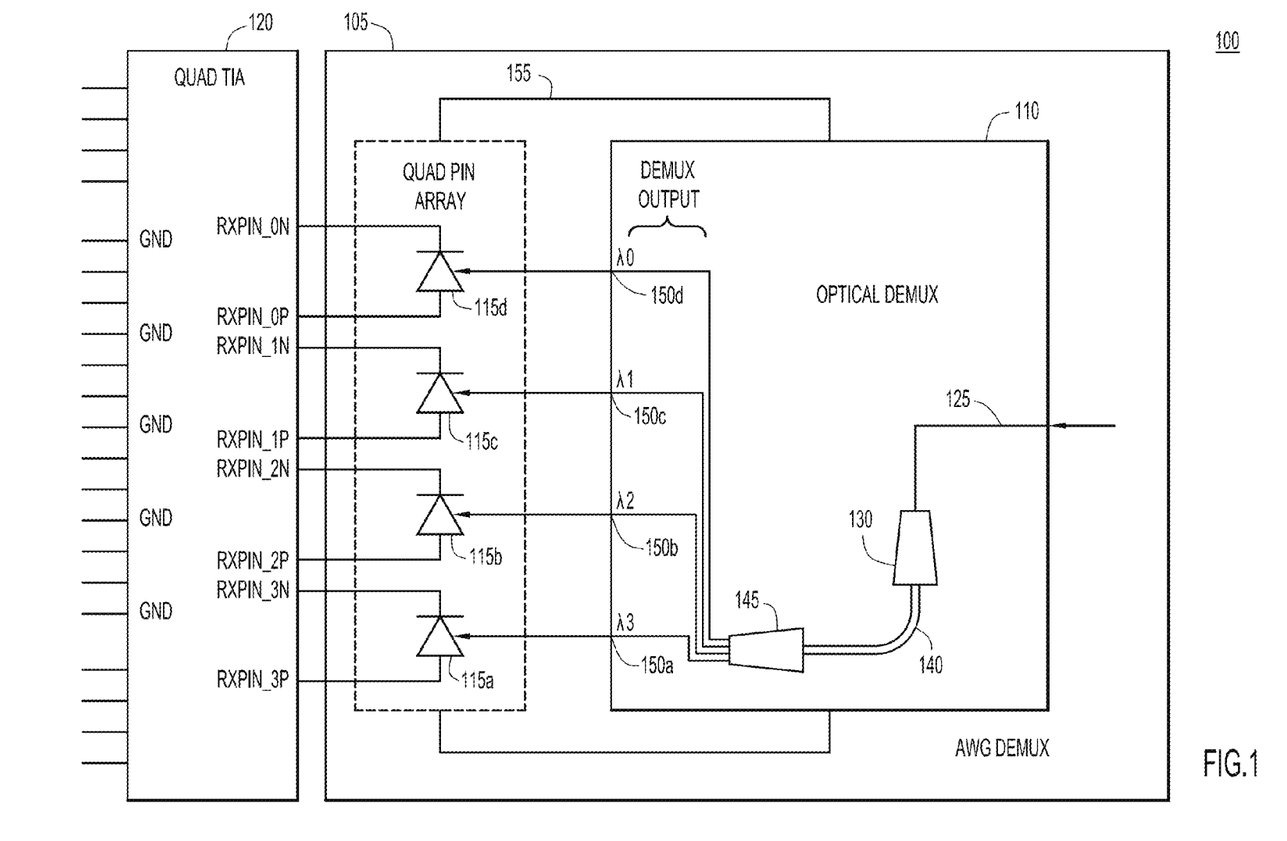
FIG. 1 is an optical receiver/transceiver subassembly configured to couple the output of a planar lightwave circuit to the photosensitive area of a photodiode without the use of any refractive optical elements.

Depicted in FIG. 1 is a planar light wave circuit assembly 105 of an optical receiver/transceiver assembly ("ROSA/TOSA") 100. A planar light wave circuit 110, such as an arrayed-waveguide grating demulitplexer, is arranged on planar light wave circuit assembly 105. A plurality of photodiodes 115a-d is also supported by light wave circuit assembly 105. In other words, the light wave circuit 110 and the photodiodes 115a-d are arranged on the same semiconductor substrate or "chip," in this case, the light wave circuit assembly 105. The electrical output from each of the photodiodes 115a-d is electrically coupled to transimpedance amplifier 120. Specifically, ROSA/TOSA 100 is arranged such that a spot size of light output from the planar light wave circuit 110 incident on a photosensitive portion of photodiodes 115a-d is small enough that an optical signal transmitted by the light output is accurately converted to an electric signal by photodiodes 115a-d.

As used herein, the spot size of the light output from planar light wave circuit 110 may be determined according to one or more definitions. For example, the spot size may be the full width at half maximum spot size, the $1/e^2$ width, the D4σ width (i.e. the second moment width), the knife-edge width, the D86 width, or the ISO11146 beam width.

In order to locate photodiodes 115a-d in the optical path such that a spot size of light output from the planar light wave circuit 110 incident on a photosensitive portion of photodiodes 115a-d is small enough that an optical signal transmitted by the light output is accurately converted to an electric signal by photodiodes 115a-d, photodiode mounting device 155 is included on, e.g., on the same chip as, planar light wave assembly 105. Specifically, mounting device 155 supports photodiodes 115a-d on planar light wave assembly 105.

When embodied in an arrayed waveguide grating ("AWG"), light wave circuit 110 may be used to demultiplex optical signals of several wavelengths traveling on a single fiber and couple the demultiplexed signals to photodiodes 115a-d. Specifically, a multiplexed optical signal is received at waveguide 125. Waveguide 125 inputs the multiplexed optical signal into a first free propagation region 130. From first free propagation region 130, the multiplexed signal enters a plurality of waveguides 140, such as a plurality of optical fibers. Because each of the plurality of waveguides 140 has a different length, the signals that enter the different waveguides undergo different phase shifts. Accordingly, when the signals exit from each of the plurality of waveguides 140 into second free propagation region 145, the signals interfere with each other in such a way that each of output waveguides 150a-d receives a signal of a particular wavelength, thereby demultiplexing the signal input to waveguide 125.

Figure 2:
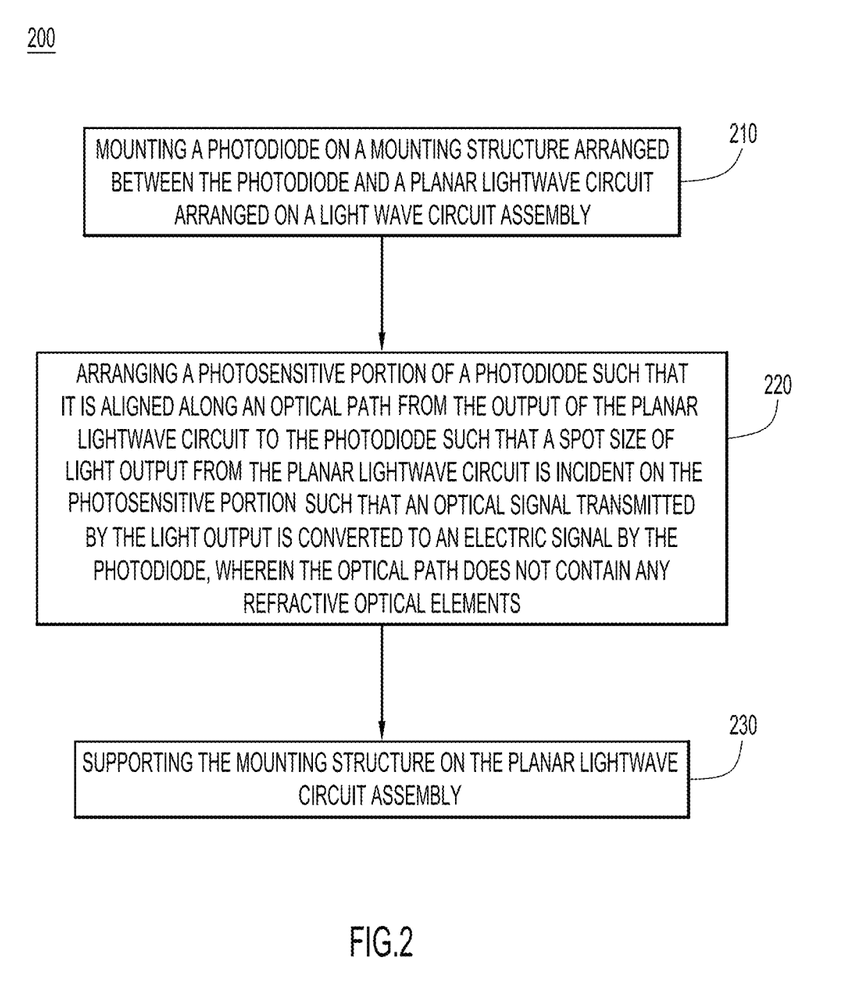
FIG. 2 is a flowchart illustrated a method of providing an optical receiver/transceiver subassembly without the use of any refractive optical elements.

Turning to FIG. 2, illustrated therein is a flowchart for a method of assembling a planar light wave circuit assembly without needing to incorporate any refractive or focusing optical elements. The process begins in 210 where a photodiode is mounted on a mounting structure. The mounting structure is arranged between the photodiode and a planar light wave circuit assembly. The planar light wave circuit is also arranged on a planar light wave circuit assembly.

In 220, a photosensitive portion of the photodiode is arranged such that it is aligned along an optical path from the output of the planar light wave circuit to the photodiode. The arrangement of the photosensitive portion of the photodiode along the optical path is chosen such that a spot size of light output from the planar light wave circuit is incident on the photosensitive portion such that an optical signal transmitted by the light output is converted to an electric signal by the photodiode. For example, the photodiode may be arranged to ensure that most if not all of the light emitted from the light wave circuit is incident on the photosensitive area of the photodiode. Furthermore, the optical path between the output of the light wave circuit and the photosensitive area of the photodiode does not contain refractive optical elements, such as collimating or focusing lenses. By eliminating refractive optical elements, the cost and complexity of a ROSA/TOSA may be reduced. According to some examples, the optical path between the output of the light wave circuit and the photosensitive contains neither refractive nor reflective optical elements, further simplifying and reducing the cost of the ROSA/TOSA.

In 230, the mounting structure is supported on the planar light wave circuit assembly. By supporting the mounting structure on the light wave circuit assembly the optical path between the output of the light wave circuit and the photosensitive area of the photodiode may be kept small enough that focusing or collimating optics can be eliminated from the assembly. Furthermore, by arranging the mounting structure as illustrated in the examples of FIGS. 3, 4, 6 and 7, reflective optical elements may also be eliminated from the assembly.

Figure 3:
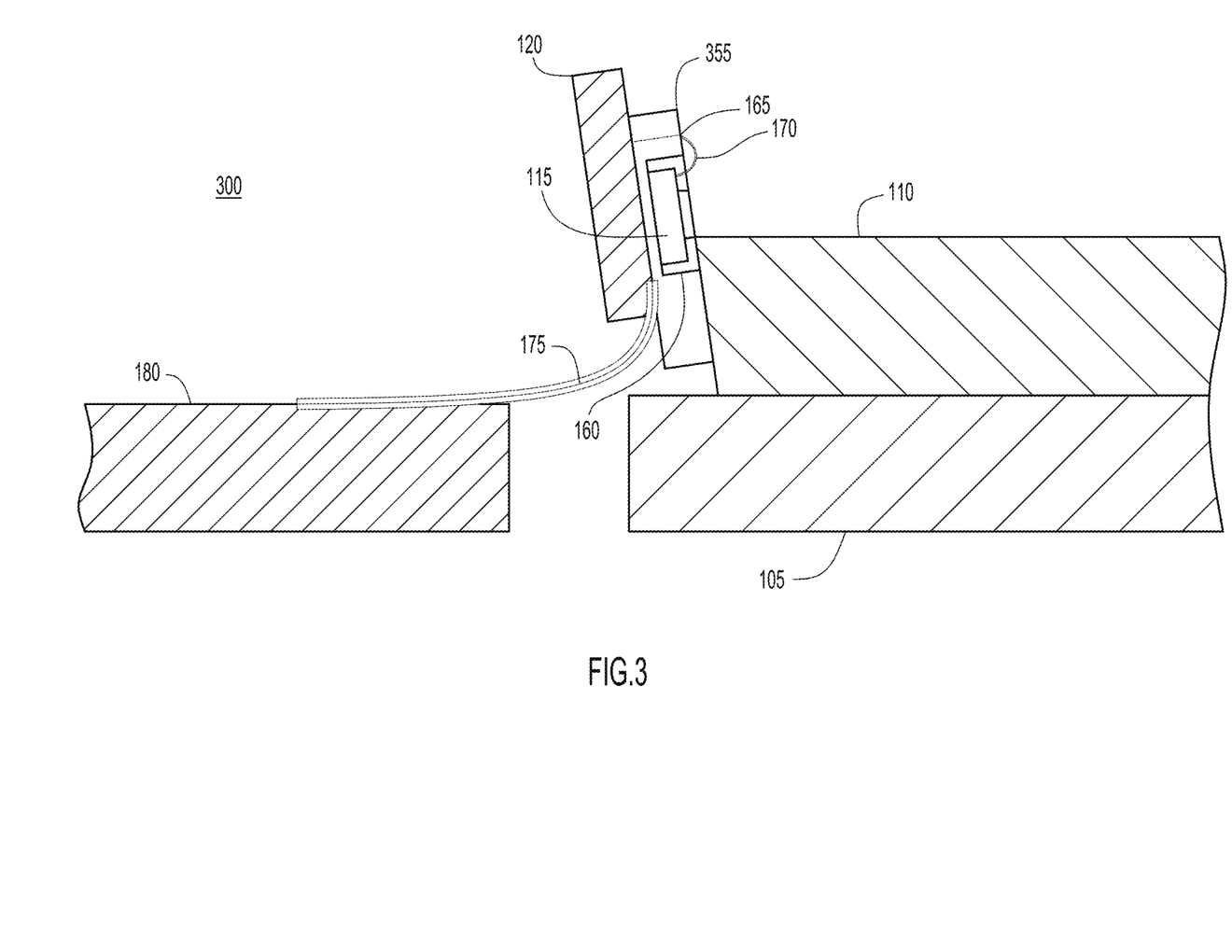
FIG. 3 is a first example optical receiver/transceiver subassembly in which a submount is used to support a photodiode on a planar light wave circuit so that the output of the planar light wave circuit is coupled to the photosensitive area of a photodiode without the use of any refractive optical elements.

With reference now made to FIG. 3, depicted therein is an example light wave circuit assembly 105 of ROSA/TOSA 300 in which photodiode 115 is supported on planar light wave circuit assembly 105. While a single photodiode 115 is illustrated, a photodiode array, such as the array illustrated in FIG. 1, may be similarly supported on planar light wave circuit assembly 105. Specifically, a submount 355 is mounted to light wave circuit 110 such that the photosensitive portion of photodiode 115 is in the optical path of the output of light wave circuit 110. Submount 355 includes recess 160 in which photodiode 115 is arranged. Recess 160 allows submount 355 to be mounted directly to light wave circuit 110 while allowing space between the output of light wave circuit 110 and the photosensitive area of photodiode 115.

Mounting photodiode 115 as illustrated, the photosensitive portion of photodiode 115 can be aligned with the output of light wave circuit 110 without needing to use any reflective or refractive optics, and without having to directly bond photodiode 115 to light wave circuit 110. Specifically, recess 160 can be chosen such that an optical signal transmitted by the output of light wave circuit 110 is accurately converted to an electric signal by photodiode 115, while simultaneously avoiding stresses to the photodiode 115 substrate that may be present if the photodiode is directly attached to light wave circuit 110. Furthermore, the depth of recess 160 may be selected so that most or all of the light emitted by light wave circuit 110 is incident on the photosensitive portion of photodiode 115.

For example, if the output of light wave circuit 110 is embodied in a waveguide that supports a mode size of 7.0 µm, the spot size of the output light will diverge to a spot size having a diameter of approximately 20 µm at a distance of about 80 µm from the edge of the waveguide. If the photosensitive area of photodiode 115 is 20 µm, recess 160 may be selected such that the distance from the output of light wave circuit 110 to the photosensitive area of photodiode 115 is at or below 80 µm, e.g., 70 µm, thereby ensuring most if not all of the light emitted from light wave circuit 110 is incident on the photosensitive area of photodiode 115. By ensuring most or all of the light emitted from light wave circuit 110 is incident on photodiode 115, ROSA/TOSA 300 can be designed to ensure that an optical signal emitted by light wave circuit 115 is accurately converted to an electrical signal by photodiode 115.

In order to transfer the electrical signal generated by photodiode 115, transimpedance amplifier 120 may be flip-chip bonded to submount 355, and electrically connected to the electrical output of photodiode 115 through via 165 formed in submount 355. Via 165 forms an electrical connection through submount 355 such that wire bond 170 may be used to connect the electrical output of photodiode 115 to via 165, which in turn, electrically connects to transimpedance amplifier 120. Flexible conductor 175 electrically connects the output of transimpedance amplifier 120 to the remaining circuitry for ROSA/TOSA 300. Specifically, flexible conductor 175 electrically connects the output of transimpedance amplifier 120 to printed circuit board 180.

Figure 4:
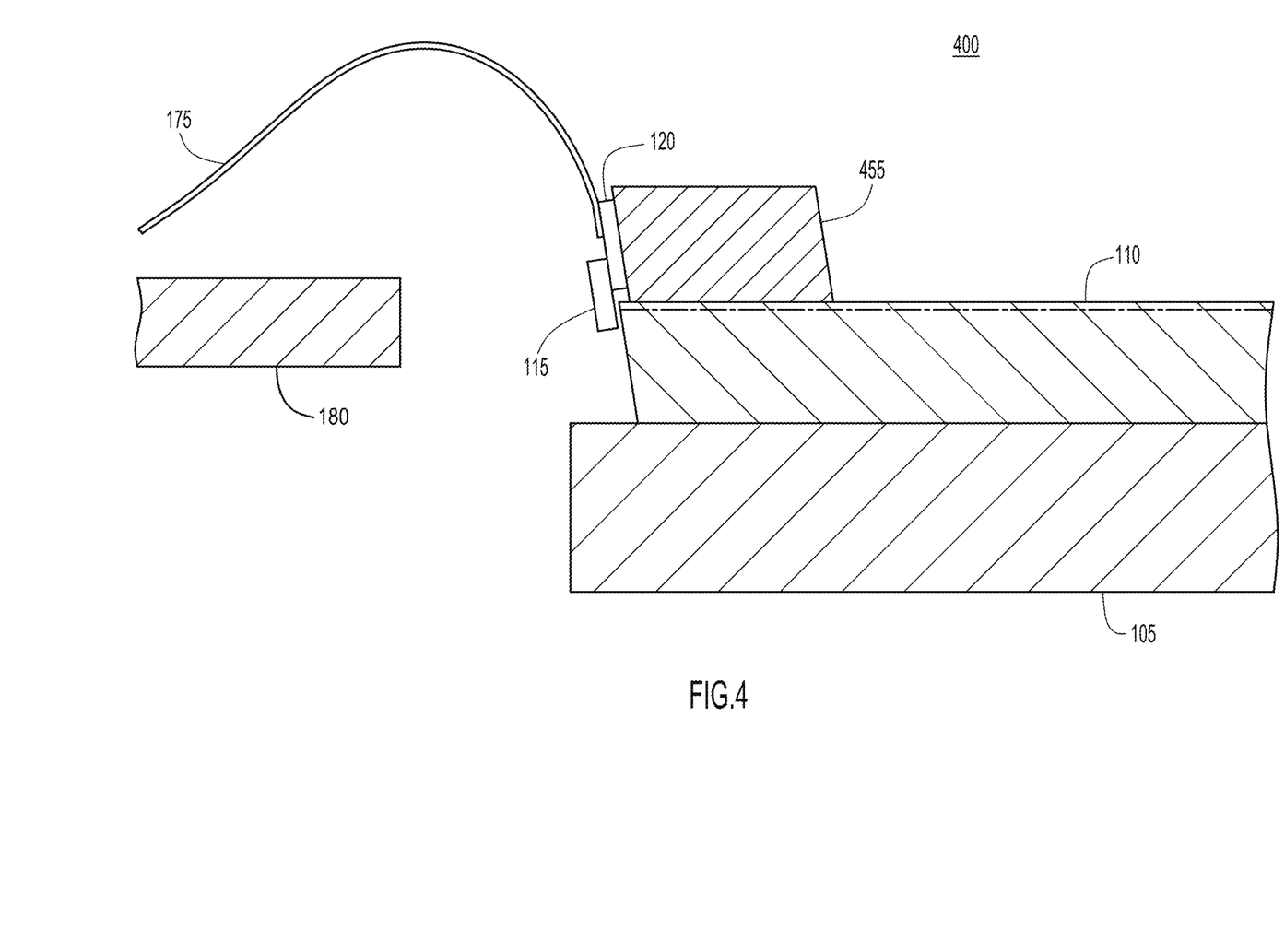
FIG. 4 is a second example optical receiver/transceiver subassembly in which a mounting block is used to support a photodiode on the planar light wave circuit so that the output of the planar light wave circuit is coupled to the photosensitive area of a photodiode without the use of any refractive optical elements.

With reference now made to FIG. 4, depicted therein is another example ROSA/TOSA 400 in which photodiode 115 is supported on planar light wave circuit assembly 105 such that an optical signal transmitted by the output of light wave circuit 110 is accurately converted to an electric signal by photodiode 115. As illustrated in FIG. 4, mounting block 455 is supported on light wave circuit 110, which is in turn supported on light wave circuit assembly 105. Mounting block 455 may be comprised of Pyrex, which has a coefficient of thermal expansion which is similar to that of the material used to construct light wave circuit 110. By selecting a material for mounting block 455 which has a coefficient of thermal expansion similar to that of light wave circuit 110, stresses between mounting block 455 and light wave circuit 110 may be avoided, and proper alignment of photodiode 115 may be ensured.

Epoxied to mounting block 455 is transimpedance amplifier 120 to which photodiode 115 has been flip chip bonded. By appropriately placing and sizing mounting block 455 based upon the sizes of transimpedance amplifier 120 and photodiode 115, photodiode 115 may be positioned such that most or all of the light emitted from light wave circuit 110 is incident on a photosensitive portion of photodiode 115. Accordingly, ROSA/TOSA 400 may be designed to ensure that an optical signal emitted by light wave circuit 115 is accurately converted to an electrical signal by photodiode 115.

The electrical connection between photodiode 115 and transimpedance amplifier 120 may be made by solder balls put in place during the flip-chip process, while flexible conductor 175 provides the electrical connections between transimpedance amplifier 120 and printed circuit board 180.

Figure 5:
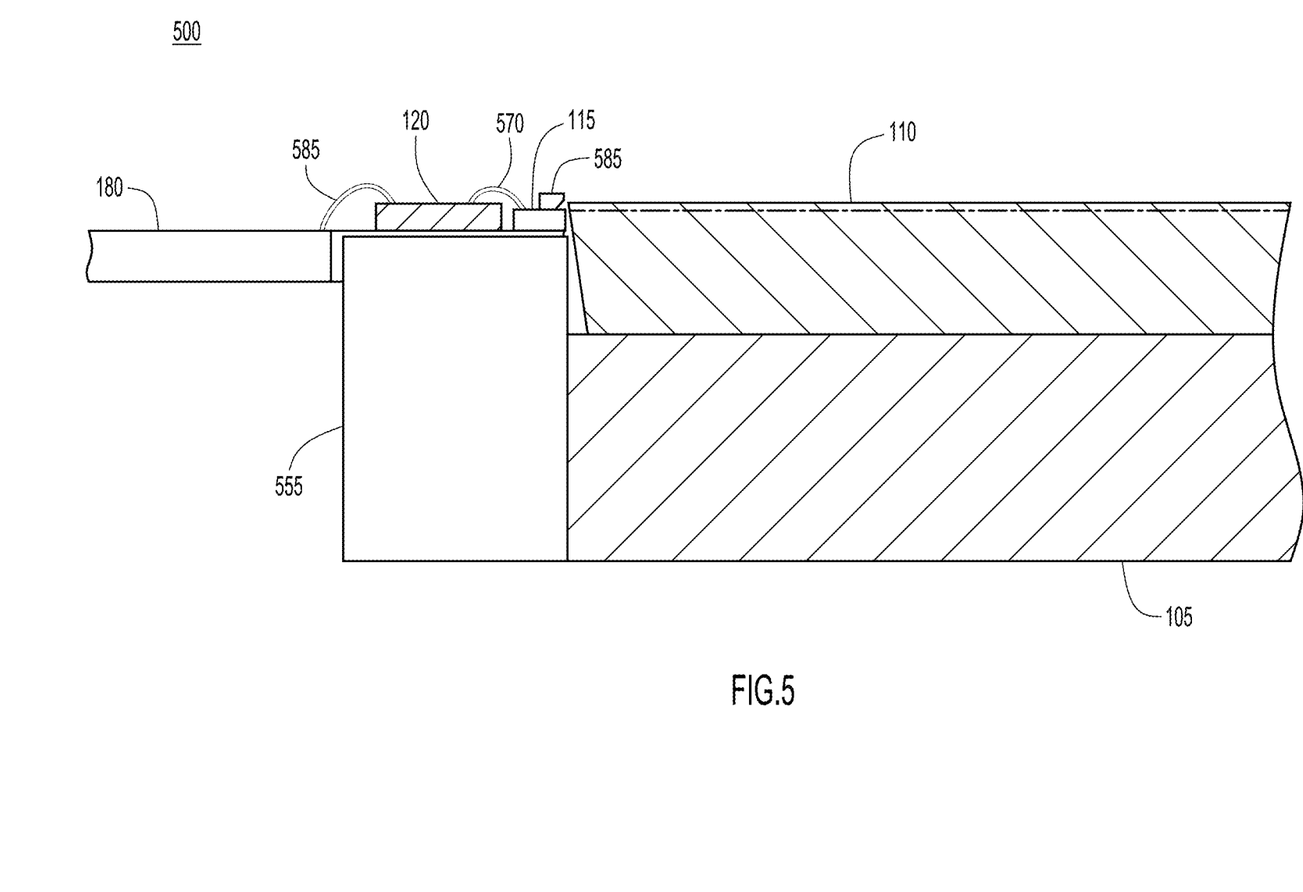
FIG. 5 is a third example optical receiver/transceiver subassembly in which a mounting block and a single reflective optical element are used to couple the output of the planar light wave circuit assembly to the photosensitive area of a photodiode without the use of any refractive optical elements.

With reference now made to FIG. 5, depicted therein is another example ROSA/TOSA 500 in which mounting block 555 is attached directly to light wave circuit assembly 105 as opposed to light wave circuit 110. Specifically, mounting block 555 extends from light wave circuit assembly 105 such that when photodiode 115 is mounted to mounting block 555, the length of the optical path from the output of light wave circuit 110 to the photosensitive area of photodiode 115 is short enough that most or all of the light emitted by light wave circuit 110 would be incident on the photosensitive portion of photodiode 115. Furthermore, mounting photodiode 115 and transimpedance amplifier 120 on top of mounting block 555 allows for easier alignment and placement of photodiode 115.

The example of FIG. 5 includes mirror 585 which bends the output of light wave circuit 110 90 degrees so that the output of light wave circuit 110 is incident on the photosensitive portion of photodiode 115. The inclusion of mounting block 555 ensures that the optical length from the output of light wave circuit 110 to the photosensitive portion of photodiode 115 is short enough that refractive optical components, such as focusing and/or collimating lenses are not needed to ensure that most or all of the light emitted by light wave circuit 110 would be incident on the photosensitive portion of photodiode 115. For example, unlike the examples of FIGS. 3 and 4 in which the vertical alignment of photodiode 115 is determined by the placement of photodiode 115 on one or more mounting structures, the vertical alignment of photodiode 115 of FIG. 5 is defined by the height of mounting block 555.

A first wire bond 570 is used to electrically connect the electrical output of photodiode 115 to transimpedance amplifier 120. Similarly, a second wire bond 585 electrically connects the output of transimpedance amplifier 120 to printed circuit board 180. The use of wire bonds 570 and 585 also add to the ease of assembly of ROSA/TOSA 500. Instead of vias, which require careful alignment of the components to be electrically connected, the placement of wire bonds 570 and 585 can be modified at the time of assembly to compensate for any misplacement of photodiode 115 and transimpedance amplifier 120.

Figure 6:
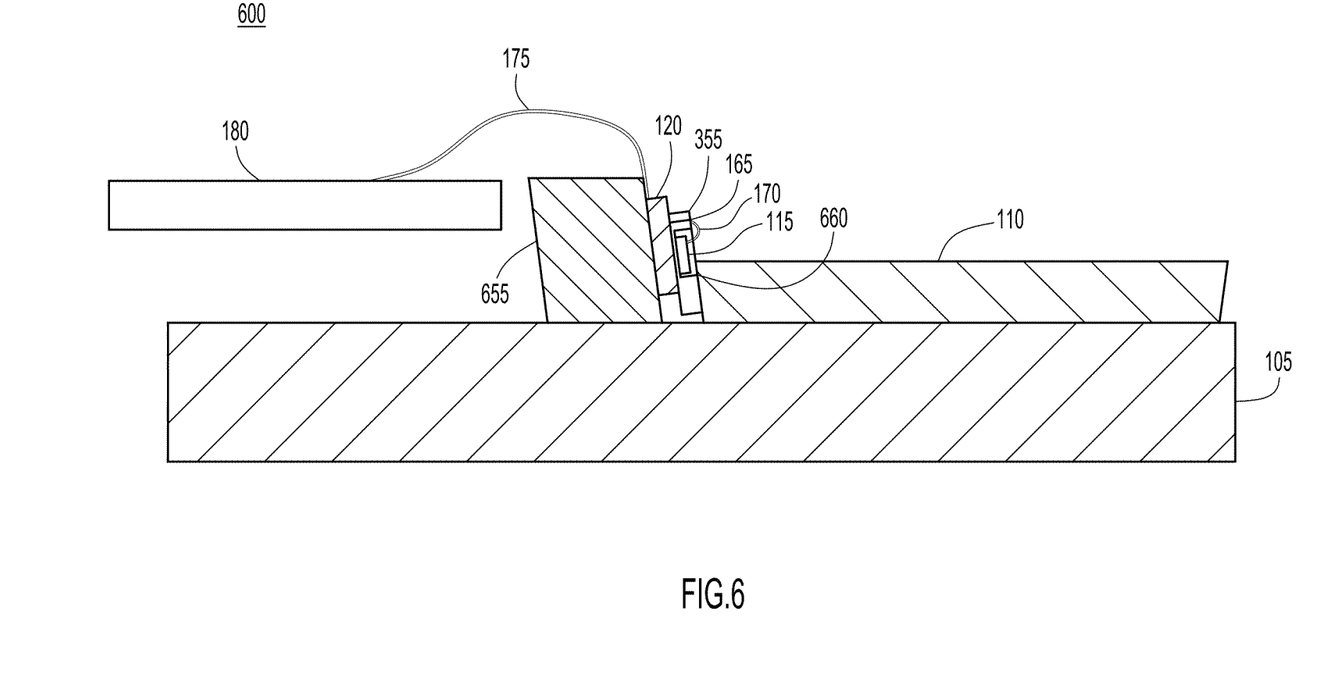
FIG. 6 is a fourth example optical receiver/transceiver subassembly in which a mounting block and a submount are used to couple the output of the planar light wave circuit to the photosensitive area of a photodiode without the use of any refractive optical elements.

With reference now made to FIG. 6, depicted therein is another example ROSA/TOSA 600 which is similar to that of FIG. 5 in that mounting block 655 is arranged in front of the output of light wave circuit 110. Unlike FIG. 5, photodiode 115 is mounted in recess 660 of a light wave circuit facing side of submount 355. By placing photodiode 115 on the light wave circuit-facing side of mounting block 655, mirror 585 from FIG. 5 is rendered unnecessary, thereby reducing the cost of ROSA/TOSA 600. Furthermore, the presence of mounting block 655 avoids any rigid connections between light wave circuit 110 and the photodiode 115 and/or structures to which photodiode 115 is mounted.

In order to transfer the electrical signals generated by photodiode 115, transimpedance amplifier 120 is provided and may be flip-chip bonded to submount 355 and epoxied to mounting block 655. The electrical output of photodiode 115 is electrical connected to transimpedance amplifier 120 through via 165 formed in submount 355. Via 165 forms an electrical connection through submount 355 such that wire bond 170 may be used to connect the electrical output of photodiode 115 to via 165, which in turn, electrically connects to transimpedance amplifier 120. Flexible conductor 175 electrically connects the output of transimpedance amplifier 120 to the remaining circuitry for ROSA/TOSA 600.

Figure 7:
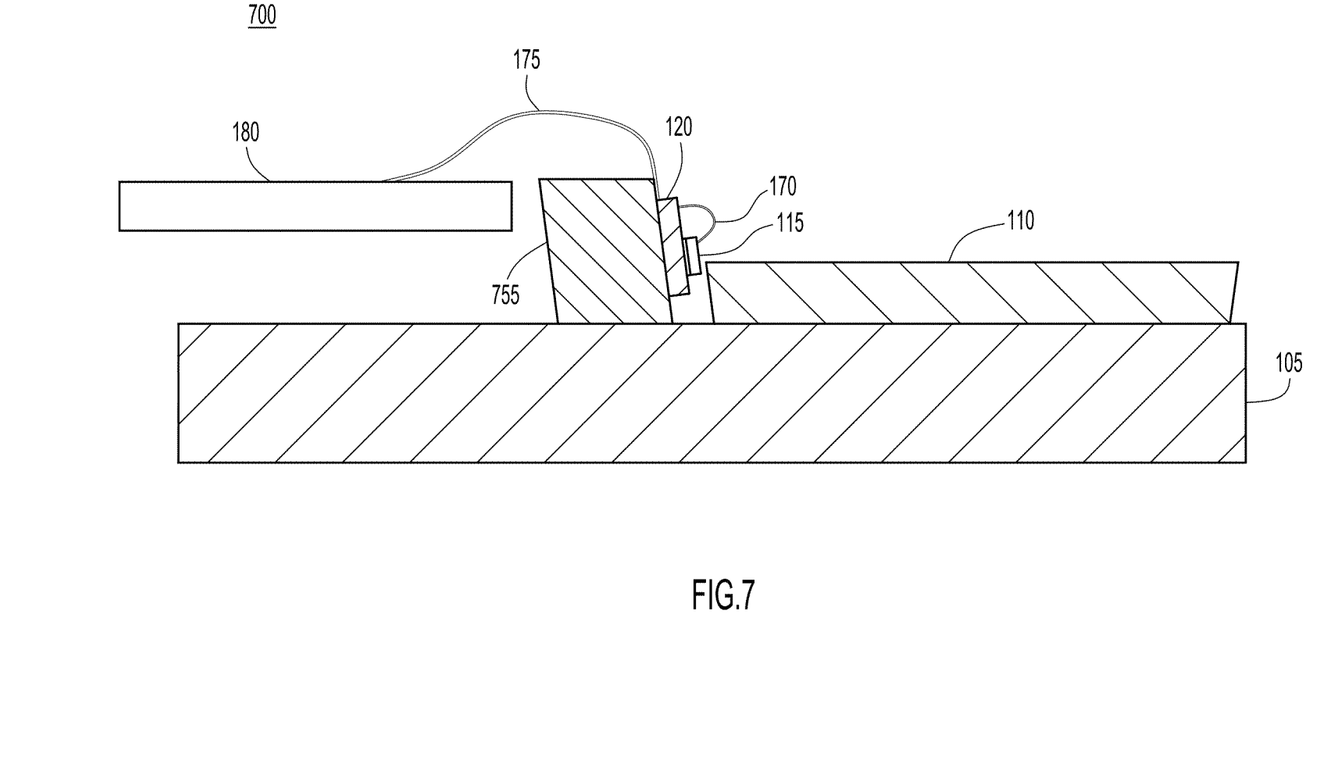
FIG. 7 is a fifth example optical receiver/transceiver subassembly in which a mounting block is used to couple the output of the planar light wave circuit to the photosensitive area of a photodiode without the use of any refractive optical elements.

With reference now made to FIG. 7, depicted therein is ROSA/TOSA 700 which does not include a submount, such as submount 355 of FIGS. 3 and 6. Instead, photodiode 115 is mounted onto transimpedance amplifier 120, which is itself epoxied to mounting block 755. Wire bond 170 electrically connects the electrical output of photodiode 115 to transimpedance amplifier 120, while flexible conductor 175 electrically connects the output of transimpedance amplifier 120 to printed circuit board 180.

Figure 8:
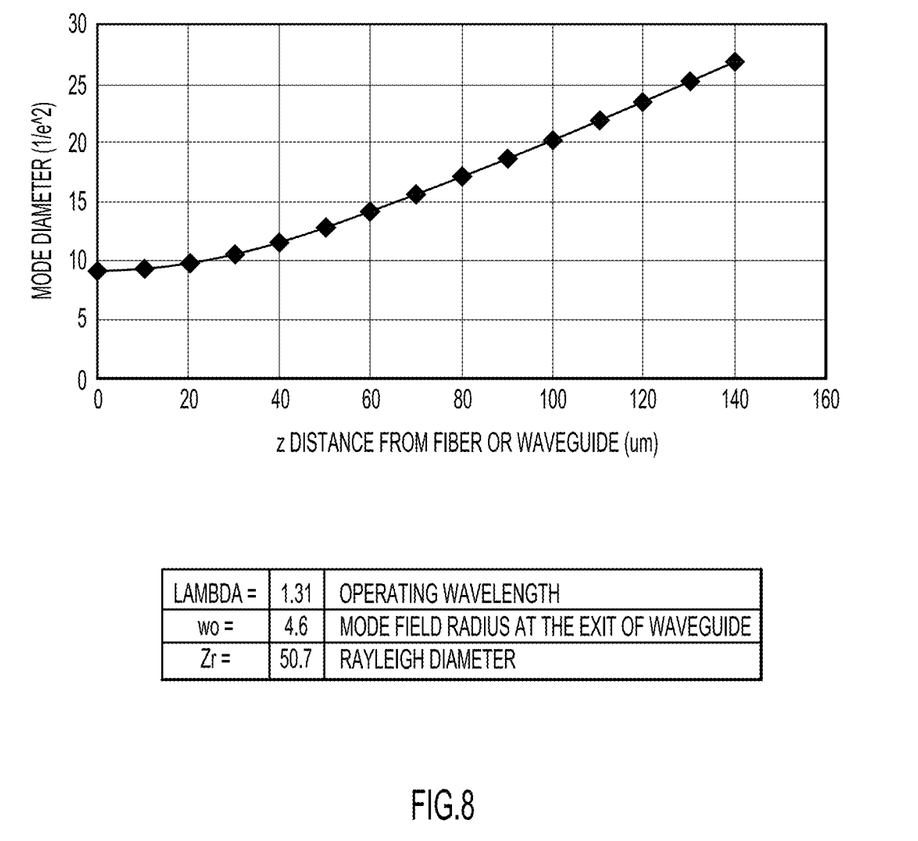
FIG. 8 is a graph relating mode diameter to the distance from the output of a first example planar light wave circuit.

With reference now made to FIG. 8, depicted therein is a graph illustrating the spot diameter, or mode diameter, for the output of an AWG as a function of the distance from the output of the AWG. Specifically, FIG. 8 shows a graph for an AWG with an operating wavelength of 1.31 µm, an output mode size of 9.2 µm, and a Rayleigh length of 50.7 µm. As illustrated by the graph, the mode diameter of the output of the AWG remains less than 20 µm up to, approximately, 100 µm from the output of the AWG. Accordingly, for a photodiode having a photosensitive area with a diameter of approximately 20 µm, the optical length from output of the AWG to the photosensitive area should be less than or equal to approximately 100 µm to ensure that the spot size of light output from the planar light wave circuit incident on photosensitive portion is small enough that an optical signal transmitted by the light output is accurately converted to an electric signal by the photodiode.

The mode field radius a distance Z from the output of the AWG is given by the following:

$$w(z) = w_0 \sqrt{1 + \left(\frac{z}{z_R}\right)^R}, \quad \text{EQ. 1}$$

where λ is the operating wavelength, $w_0$ is the mode field radius at the exit of the AWG waveguide, and $Z_R$ is the Rayleigh length. The Rayleigh length is dependent on the mode field radius and wavelength, and is given by the following relationship:

$$Z_R = \frac{\pi \omega_o^2}{\lambda}. \quad \text{EQ. 2}$$

Using the relationships of EQ. 1 and EQ. 2, example photodiodes supported on a planar light wave circuit assembly may be arranged such that the distance Z between a photosensitive portion of the photodiode and the output of the AWG satisfies the following relationship:

$$Z < Z_R \sqrt{\left(\frac{D}{2w_0}\right)^2 - 1}, \quad \text{EQ. 3}$$

where Z is a distance between the output of the AWG and the photosensitive portion of the photodiode, D is the diameter of the photosensitive portion, and $w_0$ is a radius of a mode size at the output of the planar light wave circuit.

Figure 9:
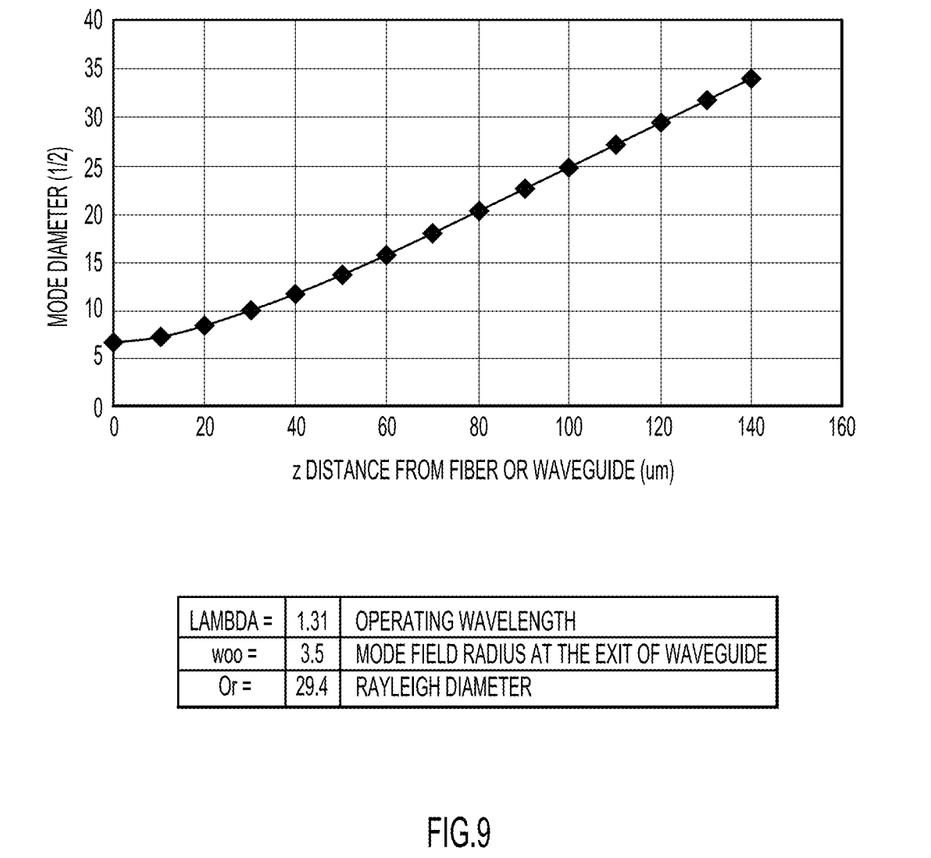
FIG. 9 is a graph relating mode diameter to the distance from the output of a second example planar light wave circuit.

Turning to FIG. 9, depicted therein is another example graph illustrating the spot size as a function of the distance from the output of the AWG. Specifically, FIG. 9 shows a graph for an AWG with slightly different properties than those illustrated in FIG. 8. For example, while the operating wavelength in the example of FIG. 9 is still 1.31 µm, the output modesize is 7.0 µm, and the Rayleigh length is 29.4 µm. As illustrated by the graph, the mode diameter of the output of the AWG remains less than 20 µm up to, approximately, 80 µm from the output of the AWG. Accordingly, for a photodiode having a photosensitive area with a diameter of approximately 20 µm, the optical length from output of the AWG to the photosensitive area should be less than or equal to approximately 80 µm to ensure that the spot size of light output from the planar light wave circuit incident on the photosensitive portion is small enough that an optical signal transmitted by the light output is accurately converted to an electric signal by the photodiode.

According to the examples described above, ROSA/TOSA assemblies may be designed which eliminate the lenses and/or focusing optics after the light is demultiplexed. Instead, according to the examples described above, the distance between the exit of the light from the waveguides of the AWG to the photodiode is kept quite small, typically 70-100 µm. By keeping the distance small, all the light emanating from the waveguides impinges on the photosensitive areas of the photodiode array. A photodiode photosensitive area diameter is typically 20-60 um and thus if the spot size is smaller than the photosensitive area, most of the light is coupled without loss. Therefore, the use of focusing optics becomes unnecessary and the light from the demultiplexer to the photodiodes is coupled at very high efficiency, with very little cross talk, very little insertion loss, and very little polarization dependent loss. Furthermore, the small insertion loss results in a ROSA/TOSA with very high sensitivity. Additionally, an added benefit is a device with a very small physical footprint.

While the techniques illustrated and described herein are embodied in one or more specific examples, it is nevertheless not intended to be limited to the details shown, since various modifications and structural changes may be made therein without departing from the scope and range of equivalents of the claims.

What is claimed is:

1. An apparatus comprising:
    a planar light wave circuit assembly comprising a planar light wave circuit and a planar light wave circuit output, wherein the planar light wave circuit output is arranged at a lateral face of the planar light wave circuit;
    a mounting device mounted directly to the lateral face of the planar light wave circuit with an electrical via and a recess formed therein;
    a transimpedance amplifier directly connected to the mounting device and suspended from the lateral surface of the planar light wave circuit by the mounting device; and
    a photodiode arranged within the recess and electrically connected to the transimpedance amplifier through the via,
    wherein the mounting device is positioned such that a photosensitive portion of the photodiode is aligned along an optical path from the output of the planar light wave circuit to the photodiode such that a spot size of light output from the planar light wave circuit is incident on the photosensitive portion such that an optical signal transmitted by the light output is converted to an electric signal by the photodiode; and
    wherein the optical path does not contain any refractive optical elements.

2. The apparatus of claim 1, wherein a length of the optical path from the output of the planar light wave circuit assembly to the photosensitive position satisfies the following relationship:

$$Z < Z_R \sqrt{\left(\frac{D}{2w_0}\right)^2 - 1},$$

where Z is a distance between an output of the planar light wave circuit and the photosensitive portion, D is the diameter of the photosensitive area, $w_o$ is a radius of a mode size at the output of the planar light wave circuit; and $Z_R$ is a Rayleigh length.

3. The apparatus of claim 1, wherein the planar light wave circuit comprises an arrayed-waveguide grating demultiplexer.

4. The apparatus of claim 1, wherein the optical path is substantially straight between the output of the planar light wave circuit and the photodiode.

5. The apparatus of claim 1, wherein the optical path does not contain any reflective optical elements.

6. The apparatus of claim 1, wherein a coefficient of thermal expansion of the mounting device is substantially the same as a coefficient of thermal expansion of the planar light wave circuit assembly.

7. A method comprising:
    mounting a first side of a mounting device to a lateral surface of a planar light wave circuit assembly;
    mounting a transimpedance amplifier to a second side of the mounting device such that the transimpedance amplifier is suspended above the planar light wave circuit assembly;
    mounting a photodiode in a recess of the mounting device such that a photosensitive portion of the photodiode is aligned along an optical path from an output of a planar light wave circuit to the photodiode and such that a spot size of light output from the planar light wave circuit is incident on the photosensitive portion such that an optical signal transmitted by the light output is converted to an electric signal by the photodiode, wherein the optical path does not contain any refractive optical elements; and
    electrically connecting the photodiode to the transimpedance amplifier through an electrical via formed in the mounting device.

8. The method of claim 7, wherein mounting the photodiode in the recess of the mounting device comprises arranging the photosensitive portion of the photodiode such that a spot size of light output from the planar light wave circuit incident on the photosensitive portion is smaller than an area of the photosensitive portion.

9. The method of claim 7, wherein mounting the photodiode in the recess of the mounting device comprises arranging the photosensitive portion such that the length of the optical path satisfies the following relationship:

$$Z < Z_R \sqrt{\left(\frac{D}{2w_0}\right)^2 - 1},$$

where Z is a distance between an output of the planar light wave circuit and the photosensitive portion, D is the diameter of the photosensitive area, $w_o$ is a radius of a mode size at the output of the planar light wave circuit; and $Z_R$ is a Rayleigh length.

10. The method of claim 7, wherein mounting the photodiode in the recess of the mounting device comprises arranging the photosensitive portion of the photodiode along the optical path of the output of the planar light wave circuit assembly such that the optical path is substantially straight between the output of the planar light wave circuit and the photodiode.

11. The apparatus of claim 10, wherein a coefficient of thermal expansion of the mounting block is substantially the same as the coefficient of thermal expansion of the planar light wave circuit assembly.

12. The method of claim 7, wherein mounting the photodiode in the recess of the mounting device comprises arranging the photosensitive portion of the photodiode along the optical path without using reflective optical elements.

13. The method of claim 7, wherein the planar light wave circuit comprises an arrayed-waveguide grating demulitplexer.

14. The method of claim 7, wherein a coefficient of thermal expansion of the mounting device is substantially the same as a coefficient of thermal expansion of the planar light wave circuit assembly.

15. An apparatus comprising:
a planar light wave circuit assembly;
a planar light wave circuit arranged on the planar light wave circuit assembly and comprising a planar light wave circuit output, wherein the planar light wave circuit output is arranged at a lateral face of the planar light wave circuit;
a mounting device mounted directly to the lateral face of the planar light wave circuit with an electrical via and a recess formed therein, and wherein the mounting device is suspended above the planar light wave circuit assemble;
a mounting block arranged on the planar light wave circuit assembly;
a transimpedance amplifier directly connected to the mounting device on a first side and directly connected to the mounting block on a second side, and suspended above the light wave circuit assembly by the mounting block and the mounting device; and
a photodiode arranged within the recess and electrically connected to the transimpedance amplifier through the via,
wherein the mounting device is positioned such that a photosensitive portion of the photodiode is aligned along an optical path from the output of the planar light wave circuit to the photodiode such that a spot size of light output from the planar light wave circuit is incident on the photosensitive portion such that an optical signal transmitted by the light output is converted to an electric signal by the photodiode; and
wherein the optical path does not contain any refractive optical elements.

16. The apparatus of claim 15, wherein a length of the optical path from the output of the planar light wave circuit assembly to the photosensitive position satisfies the following relationship:

$$Z < Z_R \sqrt{\left(\frac{D}{2w_0}\right)^2 - 1},$$

where Z is a distance between an output of the planar light wave circuit and the photosensitive portion, D is the diameter of the photosensitive area, $w_o$ is a radius of a mode size at the output of the planar light wave circuit; and $Z_R$ is a Rayleigh length.

17. The apparatus of claim 15, wherein the planar light wave circuit comprises an arrayed-waveguide grating demulitplexer.

18. The apparatus of claim 15, wherein the optical path is substantially straight between the output of the planar light wave circuit and the photodiode.

19. The apparatus of claim 15, wherein the optical path does not contain any reflective optical elements.

20. The apparatus of claim 15, wherein a coefficient of thermal expansion of the mounting device is substantially the same as a coefficient of thermal expansion of the planar light wave circuit assembly.

* * * * *